United States Patent
Wu et al.

(10) Patent No.: US 11,847,065 B2
(45) Date of Patent: Dec. 19, 2023

(54) MEMORY SUB-SYSTEM MANAGEMENT OF FIRMWARE BLOCK RECORD AND DEVICE BLOCK RECORD

(71) Applicant: Micron Technology, Inc., Boise, ID (US)

(72) Inventors: Jiangang Wu, Milpitas, CA (US); Jung Sheng Hoei, Newark, CA (US); Qisong Lin, El Dorado Hills, CA (US); Mark Ish, San Ramon, CA (US); Peng Xu, Milpitas, CA (US)

(73) Assignee: Micron Technology, Inc., Boise, ID (US)

( * ) Notice: Subject to any disclaimer, the term of this patent is extended or adjusted under 35 U.S.C. 154(b) by 0 days.

(21) Appl. No.: 17/410,842

(22) Filed: Aug. 24, 2021

(65) Prior Publication Data
US 2021/0382829 A1    Dec. 9, 2021

Related U.S. Application Data

(63) Continuation of application No. 16/781,941, filed on Feb. 4, 2020, now Pat. No. 11,132,303.

(51) Int. Cl.
*G06F 12/12* (2016.01)
*G06F 3/06* (2006.01)

(52) U.S. Cl.
CPC ............ *G06F 12/12* (2013.01); *G06F 3/0608* (2013.01); *G06F 3/0652* (2013.01); *G06F 3/0659* (2013.01); *G06F 3/0673* (2013.01)

(58) Field of Classification Search
CPC ...... G06F 3/0659; G06F 3/0652; G06F 3/064; G06F 3/0629; G06F 3/0608; G06F 12/12; G06F 11/1072; G06F 3/0679; G06F 11/2069; G06F 11/1461; G11C 11/5628; G11C 16/10; G11C 16/0483; G11C 16/30
USPC ................................................ 711/159, 103
See application file for complete search history.

(56) References Cited

U.S. PATENT DOCUMENTS

| | | | | |
|---|---|---|---|---|
| 7,734,887 B1 * | 6/2010 | Stringham | .......... | G06F 11/1469 |
| | | | | 711/165 |
| 8,386,695 B2 * | 2/2013 | Gorobets | ............ | G06F 12/0246 |
| | | | | 711/E12.008 |
| 2013/0067138 A1 * | 3/2013 | Schuette | ............... | G06F 3/0629 |
| | | | | 711/E12.008 |
| 2017/0287568 A1 * | 10/2017 | Yang | .................. | G11C 16/3431 |
| 2018/0301193 A1 | 10/2018 | Srinivasan et al. | | |

* cited by examiner

*Primary Examiner* — Hashem Farrokh
(74) *Attorney, Agent, or Firm* — Lowenstein Sandler LLP

(57) ABSTRACT

A request to perform a program operation at a memory device is received. Whether a firmware block record is to be modified to correspond with a device block record is determined based on parameters associated with the program operation. The firmware block record tracks entries of the device block record. Responsive to determining that the firmware block record is to be modified, the firmware block record is modified to correspond with the device block record.

20 Claims, 11 Drawing Sheets

| 2-2 interface | | Subblock (SB) 0 | | | SB 1 | | | SB 2 | | |
|---|---|---|---|---|---|---|---|---|---|---|
| # of bits | | XP | UP | LP | XP | UP | LP | XP | UP | LP |
| wl | 0 | ? | ? | 0 | ? | ? | 1 | ? | ? | 2 |
| | 1 | ? | 4 | 3 | ? | 6 | 5 | ? | 8 | 7 |
| | 2 | 15 | 16 | 9 | 18 | 19 | 10 | 21 | 22 | 11 |
| | 3 | 24 | 25 | 12 | 27 | 28 | 13 | 30 | 31 | 14 |
| | 3 | 32 | 33 | 17 | 34 | 35 | 20 | 36 | 37 | 23 |

| Entry | F/W block record 115 | | Device block record 137 | | | |
|---|---|---|---|---|---|---|
| | Block per Plane | Plane Mask | Block per Plane | Plane | Wordline | Start Voltage |
| 1 | 0 | 4b'0000 | 0 | 0 | 3 | 12 |
| 2 | 1 | 4b'0000 | 1 | 2 | 4 | 12.5 |
| 3 | 2 | 4b'0000 | 2 | 3 | 1 | 12.1 |
| 4 | 3 | 4b'0000 | 3 | 1 | 5 | 12.2 |
| 5 | 4 | 4b'0000 | 4 | 1 | 6 | 12.3 |
| 6 | 5 | 4b'0000 | 5 | 2 | 7 | 12.4 |
| 7 | 6 | 4b'0000 | 6 | 3 | 8 | 12.2 |
| 8 | 7 | 4b'0000 | 7 | 3 | 9 | 12.5 |

| Recently used entry table 122 | 1 -> 2 -> 3 -> 4 -> 5 -> 6 -> 7 -> 8 |
|---|---|

300

350

| Entry | F/W block record 115 | | | | Device block record 137 | | | |
|---|---|---|---|---|---|---|---|---|
| | Block per Plane | Plane Mask | | | Block per Plane | Plane | Wordline | Start Voltage |
| 1 | 11 | 4b'0000 | | | 11 | 2 | 0 | 11.9 |
| 2 | 1 | 4b'0000 | | | 1 | 2 | 4 | 12.5 |
| 3 | 2 | 4b'0000 | | | 2 | 3 | 1 | 12.1 |
| 4 | 3 | 4b'0000 | | | 3 | 1 | 5 | 12.2 |
| 5 | 4 | 4b'0000 | | | 4 | 2 | 6 | 12.3 |
| 6 | 5 | 4b'0000 | | | 5 | 2 | 7 | 12.4 |
| 7 | 6 | 4b'0000 | | | 6 | 3 | 8 | 12.2 |
| 8 | 7 | 4b'0000 | | | 7 | 3 | 9 | 12.5 |

| Recently used entry table 122 | 2 -> 3 -> 4 -> 5 -> 6 -> 7 -> 8 -> 1 |
|---|---|

FIG. 3B

MEMORY SUB-SYSTEM MANAGEMENT OF FIRMWARE BLOCK RECORD AND DEVICE BLOCK RECORD

RELATED APPLICATION

This application is a continuation of U.S. patent application Ser. No. 16/781,941 filed on Feb. 4, 2020, the entire contents of which are hereby incorporated by reference herein.

TECHNICAL FIELD

Embodiments of the disclosure relate generally to memory sub-systems, and more specifically, relate to a memory sub-system management of a firmware block record and a device block record.

Embodiments of the disclosure relate generally to memory sub-systems, and more specifically, relate to a memory sub-system management of a firmware block record and a device block record.

BACKGROUND

A memory sub-system can include one or more memory devices that store data. The memory devices can be, for example, non-volatile memory devices and volatile memory devices. In general, a host system can utilize a memory sub-system to store data at the memory devices and to retrieve data from the memory devices.

BRIEF DESCRIPTION OF THE DRAWINGS

The disclosure will be understood more fully from the detailed description given below and from the accompanying drawings of various embodiments of the disclosure. The drawings, however, should not be taken to limit the disclosure to the specific embodiments, but are for explanation and understanding only.

FIG. 3B is a diagram illustrating an example of an updated firmware block list, an updated device block list, and an updated recently used entry table, in accordance with some embodiments of the disclosure.

DETAILED DESCRIPTION

Figure 1:
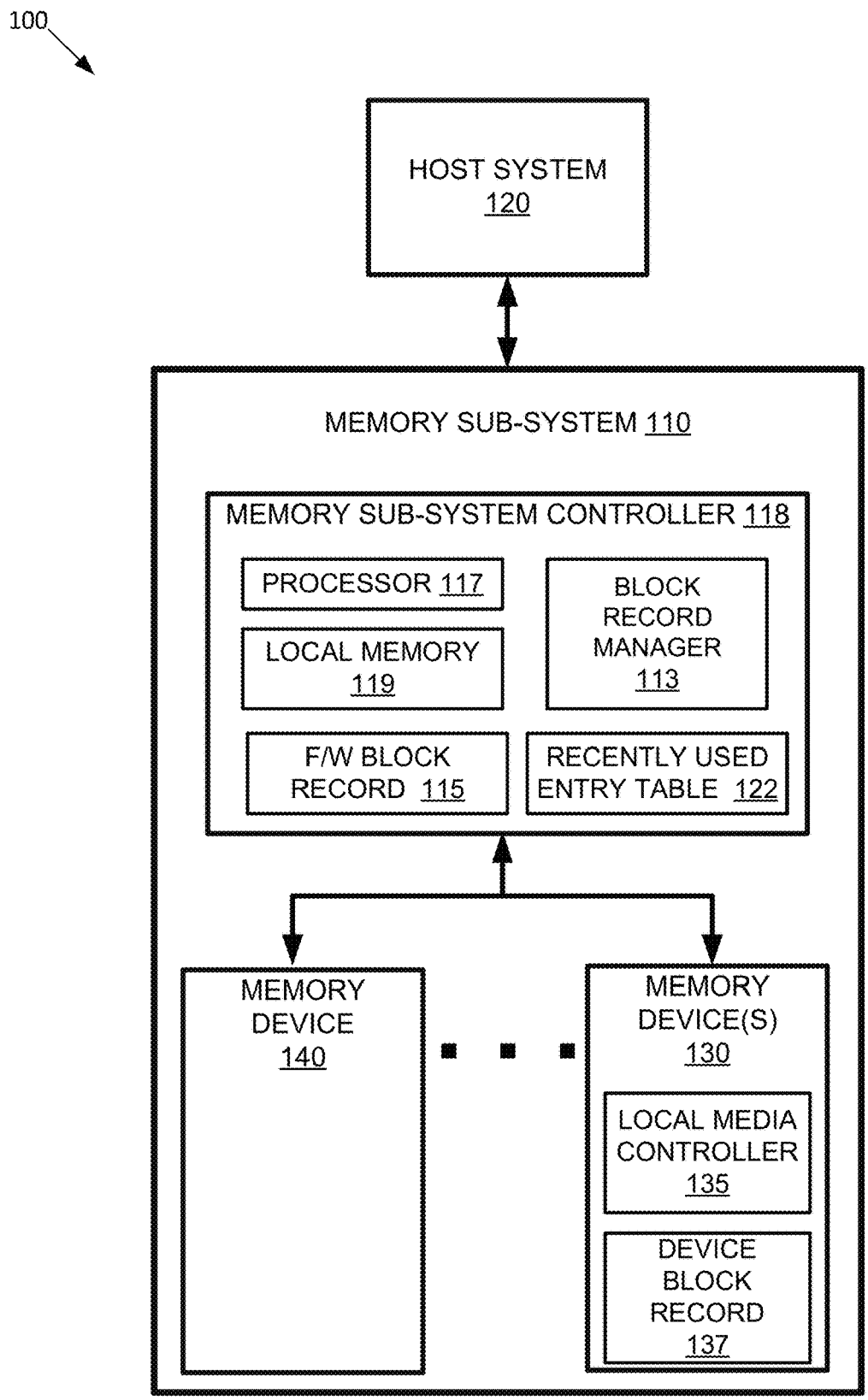
FIG. 1 illustrates an example computing system that includes a memory sub-system, in accordance with some embodiments of the present disclosure.

Aspects of the present disclosure are directed to managing firmware block records and device block records of memory sub-systems. A memory sub-system can be a storage device, a memory module, or a hybrid of a storage device and memory module. Examples of storage devices and memory modules are described below in conjunction with FIG. 1. In general, a host system can utilize a memory sub-system that includes one or more components, such as memory devices that store data. The host system can provide data to be stored at the memory sub-system and can request data to be retrieved from the memory sub-system.

A memory device can be a non-volatile memory device. One example of non-volatile memory devices is a negative-and (NAND) memory device. Other examples of non-volatile memory devices are described below in conjunction with FIG. 1. A non-volatile memory device is a package of one or more dice. Each die can consist of one or more planes. Planes can be groups into logic units (LUN). For some types of non-volatile memory devices (e.g., NAND devices), each plane consists of a set of physical blocks. Each block consists of a set of pages. Each page consists of a set of memory cells ("cells"). A cell is an electronic circuit that stores information. Depending on the cell type, a cell can store one or more bits of binary information, and has various logic states that correlate to the number of bits being stored. The logic states can be represented by binary values, such as "0" and "1", or combinations of such values.

A memory device is made up of bits arranged in a two-dimensional grid. Memory cells are etched onto a silicon wafer in an array of columns (also hereinafter referred to as bitlines) and rows (also hereinafter referred to as wordlines). A wordline can refer to one or more rows of memory cells of a memory device that are used with one or more bitlines to generate the address of each of the memory cells. The intersection of a bitline and wordline constitutes the address of the memory cell. A data block hereinafter refers to a unit of the memory device used to store data and can include a group of memory cells, a word line group, a word line, or individual memory cells.

A wordline start voltage can refer to a start voltage (e.g., selected from a sequence of incremented voltages) that can be applied to a wordline for programming memory cells coupled to the wordline. A wordline can be coupled to multiple pages of a block of memory. The wordline start voltage can be determined using an automated dynamic wordline start voltage (ADWLSV) operation. The ADWLSV operation can determine a wordline start voltage for a page by programming the page at each of the sequence of voltages until the data is validly programmed to the page (e.g., without errors or the number of errors is less than the correction capability of Error-Correcting Code (ECC)). The ADWLSV operation can determine a wordline start voltage for the first page of a wordline and use the determined wordline start voltage for every subsequent page of the wordline, which reduces latency of programming a block of memory cells at least because using the wordline start voltage to program subsequent pages of a wordline reduces the number of voltages of the sequence of voltages used to program the subsequent pages of the wordline.

A device block record can be used by the memory device to store wordline start voltages (e.g., ADWLSV) for multiple open blocks of a die of a memory device. In some embodiments, a record can include a data structure (e.g., table) with one or more entries. In some embodiments, a record can be an entry of a data structure. The contents of the device block record are not made available to the memory sub-system controller. The device block record can have a defined number of entries. Each entry can store wordline start voltage information, such as the wordline start voltage for a particular wordline of a particular block of memory cells at a physical memory die. The wordline start voltages recorded in entries of the device block record can be used to program open blocks of the memory device. When a block is closed, the entry for the particular block can be released and be made available for wordline start voltage information of another block. The device block record can quickly become full, especially in view of multi-plane write operations. Further, under some conditions (e.g., retirement of a block listed in an entry of the device block record), entries in the device block record are not released or released too slowly. If the device block record is full such that the wordline start voltage of a newly opened block cannot be recorded in the device block record, the memory device can determine the wordline start voltage for each page of the wordline of the new block (e.g., increments the sequence of voltages for each page of a wordline to determine the correct wordline start voltages for each page), which creates additional latency in programming the memory device.

Aspects of the disclosure address the above and other deficiencies by creating and maintaining (e.g., by the memory sub-system controller) a firmware block record that attempts track the contents and changes in content of the device block record. Since the memory sub-system controller does not have access to the contents of the device block record stored at the memory device, the memory sub-system controller can infer the contents of the device block record and maintain the firmware block record by implementing similar logic used to create and update the device block record. In particular, the memory sub-system controller can update the firmware block record to track changes to the device block record that are responsive to performing program operation at the memory device. The memory sub-system controller can determine, using the firmware block record, when to send a command to the memory device that causes the memory device to remove a specified entry from the device block record, which creates a free entry in the device block record that can be used to store new wordline start voltage information and improve latency.

In some embodiments, a request to perform a program operation at a memory device is received. An entry of a device block record stored at the memory device is determined to be removed based on parameters associated with the program operation and a firmware block record that corresponds to the device block record. The firmware block record tracks the entries of the device block record. The entries of the device block record are associated with blocks of the memory device and identify start voltages that are applied to wordlines of the blocks to program memory cells associated with the wordlines. A command is submitted to the memory device to remove the entry associated with a particular block from the device block record and to make a space available at the device block record for a new entry associated with a new block that is to be written in view of the program operation.

Advantages of the disclosure include, but are not limited to, improved performance of the memory sub-system, and in particular, improving the latency of the memory sub-system in performing program operations. By creating a firmware block record that tracks the contents of a device block record, the memory sub-system controller can determine when to send commands to the memory device to release entries from the device block record. The released entries of the device block record can be used to store new wordline start voltage information that can be used to improve the program times of the memory sub-system in performing program operations.

FIG. 1 illustrates an example computing system 100 that includes a memory sub-system 110 in accordance with some embodiments of the present disclosure. The memory sub-system 110 can include media, such as one or more volatile memory devices (e.g., memory device 140), one or more non-volatile memory devices (e.g., memory device 130), or a combination of such.

A memory sub-system 110 can be a storage device, a memory module, or a hybrid of a storage device and memory module. Examples of a storage device include a solid-state drive (SSD), a flash drive, a universal serial bus (USB) flash drive, an embedded Multi-Media Controller (eMMC) drive, a Universal Flash Storage (UFS) drive, a secure digital (SD) card, and a hard disk drive (HDD). Examples of memory modules include a dual in-line memory module (DIMM), a small outline DIMM (SO-DIMM), and various types of non-volatile dual in-line memory module (NVDIMM).

The computing system 100 can be a computing device such as a desktop computer, laptop computer, network server, mobile device, a vehicle (e.g., airplane, drone, train, automobile, or other conveyance), Internet of Things (IoT) enabled device, embedded computer (e.g., one included in a vehicle, industrial equipment, or a networked commercial device), or such computing device that includes memory and a processing device.

The computing system 100 can include a host system 120 that is coupled to one or more memory sub-systems 110. In some embodiments, the host system 120 is coupled to different types of memory sub-systems 110. FIG. 1 illustrates one example of a host system 120 coupled to one memory sub-system 110. As used herein, "coupled to" or "coupled with" generally refers to a connection between components, which can be an indirect communicative connection or direct communicative connection (e.g., without intervening components), whether wired or wireless, including connections such as electrical, optical, magnetic, and the like.

The host system 120 can include a processor chipset and a software stack executed by the processor chipset. The processor chipset can include one or more cores, one or more caches, a memory controller (e.g., NVDIMM controller), and a storage protocol controller (e.g., PCIe controller, SATA controller). The host system 120 uses the memory sub-system 110, for example, to write data to the memory sub-system 110 and read data from the memory sub-system 110.

The host system 120 can be coupled to the memory sub-system 110 via a physical host interface. Examples of a physical host interface include, but are not limited to, a serial advanced technology attachment (SATA) interface, a peripheral component interconnect express (PCIe) interface, universal serial bus (USB) interface, Fibre Channel, Serial Attached SCSI (SAS), Small Computer System Interface (SCSI), a double data rate (DDR) memory bus, a dual in-line memory module (DIMM) interface (e.g., DIMM socket interface that supports Double Data Rate (DDR)), Open NAND Flash Interface (ONFI), Double Data Rate (DDR), Low Power Double Data Rate (LPDDR), or any other interface. The physical host interface can be used to transmit data between the host system 120 and the memory sub-system 110. The host system 120 can further utilize an NVM Express (NVMe) interface to access components (e.g., memory devices 130) when the memory sub-system 110 is coupled with the host system 120 by the PCIe interface. The physical host interface can provide an interface for passing control, address, data, and other signals between the memory sub-system 110 and the host system 120. FIG. 1 illustrates a memory sub-system 110 as an example. In general, the host system 120 can access multiple memory sub-systems via a same communication connection, multiple separate communication connections, and/or a combination of communication connections.

The memory devices 130, 140 can include any combination of the different types of non-volatile memory devices and/or volatile memory devices. The volatile memory devices (e.g., memory device 140) can be, but are not limited to, random access memory (RAM), such as dynamic random access memory (DRAM) and synchronous dynamic random access memory (SDRAM).

Some examples of non-volatile memory devices (e.g., memory device 130) includes a negative-and (NAND) type flash memory and write-in-place memory, such as a three-dimensional cross-point ("3D cross-point") memory device, which is a cross-point array of non-volatile memory cells. A cross-point array of non-volatile memory can perform bit storage based on a change of bulk resistance, in conjunction with a stackable cross-gridded data access array. Additionally, in contrast to many flash-based memories, cross-point non-volatile memory can perform a write in-place operation, where a non-volatile memory cell can be programmed without the non-volatile memory cell being previously erased. NAND type flash memory includes, for example, two-dimensional NAND (2D NAND) and three-dimensional NAND (3D NAND).

Each of the memory devices 130 can include one or more arrays of memory cells. One type of memory cell, for example, single level cells (SLC) can store one bit per cell. Other types of memory cells, such as multi-level cells (MLCs), triple level cells (TLCs), and quad-level cells (QLCs), can store multiple bits per cell. In some embodiments, each of the memory devices 130 can include one or more arrays of memory cells such as SLCs, MLCs, TLCs, QLCs, or any combination of such. In some embodiments, a particular memory device can include an SLC portion, and an MLC portion, a TLC portion, or a QLC portion of memory cells. The memory cells of the memory devices 130 can be grouped as pages that can refer to a logical unit of the memory device used to store data. With some types of memory (e.g., NAND), pages can be grouped to form blocks.

Although non-volatile memory components such as NAND type flash memory (e.g., 2D NAND, 3D NAND) and 3D cross-point array of non-volatile memory cells are described, the memory device 130 can be based on any other type of non-volatile memory, such as read-only memory (ROM), phase change memory (PCM), self-selecting memory, other chalcogenide based memories, ferroelectric transistor random-access memory (FeTRAM), ferroelectric random access memory (FeRAM), magneto random access memory (MRAM), Spin Transfer Torque (STT)-MRAM, conductive bridging RAM (CBRAM), resistive random access memory (RRAM), oxide based RRAM (OxRAM), negative-or (NOR) flash memory, and electrically erasable programmable read-only memory (EEPROM).

A memory sub-system controller 118 (or controller 118 for simplicity) can communicate with the memory devices 130 to perform operations such as reading data, writing data, or erasing data at the memory devices 130 and other such operations. The memory sub-system controller 118 can include hardware such as one or more integrated circuits and/or discrete components, a buffer memory, or a combination thereof. The hardware can include digital circuitry with dedicated (i.e., hard-coded) logic to perform the operations described herein. The memory sub-system controller 118 can be a microcontroller, special purpose logic circuitry (e.g., a field programmable gate array (FPGA), an application specific integrated circuit (ASIC), etc.), or other suitable processor.

The memory sub-system controller 118 can include a processing device 117 (processor) configured to execute instructions stored in local memory 119. In the illustrated example, the local memory 119 of the memory sub-system controller 118 includes an embedded memory configured to store instructions for performing various processes, operations, logic flows, and routines that control operation of the memory sub-system 110, including handling communications between the memory sub-system 110 and the host system 120.

In some embodiments, the local memory 119 can include memory registers storing memory pointers, fetched data, etc. The local memory 119 can also include read-only memory (ROM) for storing micro-code. While the example memory sub-system 110 in FIG. 1 has been illustrated as including the memory sub-system controller 118, in another embodiment of the present disclosure, a memory sub-system 110 does not include a memory sub-system controller 118, and can instead rely upon external control (e.g., provided by an external host, or by a processor or controller separate from the memory sub-system).

In general, the memory sub-system controller 118 can receive commands or operations from the host system 120 and can convert the commands or operations into instructions or appropriate commands to achieve the desired access to the memory devices 130 and/or the memory device 140. The memory sub-system controller 118 can be responsible for other operations such as wear leveling operations, garbage collection operations, error detection and error-correcting code (ECC) operations, encryption operations, caching operations, and address translations between a logical address (e.g., logical block address (LBA), namespace) and a physical address (e.g., physical block address) that are associated with the memory devices 130. The memory sub-system controller 118 can further include host interface circuitry to communicate with the host system 120 via the physical host interface. The host interface circuitry can convert the commands received from the host system into command instructions to access the memory devices 130 and/or the memory device 140 as well as convert responses associated with the memory devices 130 and/or the memory device 140 into information for the host system 120.

The memory sub-system 110 can also include additional circuitry or components that are not illustrated. In some embodiments, the memory sub-system 110 can include a cache or buffer (e.g., DRAM) and address circuitry (e.g., a row decoder and a column decoder) that can receive an address from the memory sub-system controller 118 and decode the address to access the memory devices 130.

In some embodiments, the memory devices 130 include local media controllers 135 that operate in conjunction with memory sub-system controller 118 to execute operations on one or more memory cells of the memory devices 130. An external controller (e.g., memory sub-system controller 118) can externally manage the memory device 130 (e.g., perform media management operations on the memory device 130). In some embodiments, a memory device 130 is a managed memory device, which is a raw memory device combined with a local controller (e.g., local controller 135) for media management within the same memory device package. An example of a managed memory device is a managed NAND (MNAND) device.

In some embodiments, a memory device 130 can be a non-volatile memory device. In some embodiments, a non-volatile memory device is a physical package of one or more die (e.g., such as a memory device that is in its own discrete physical package with external pins or electrical contacts). A die can refer to a block of material, such as semiconducting material, on which a functional electronic circuit is fabricated. A memory device, such as memory device 130, can include one or more die. Each die can consist of one or more planes. For some types of non-volatile memory devices (e.g., negative-and (NAND) devices), each plane consists of a set of physical blocks. One or more blocks can be grouped together to form a plane of the memory component in order to allow concurrent operations (e.g., parallelism) to take place on each plane (e.g., multi-plane write). Each block consists of a set of pages. Each page consists of a set of memory cells, which store bits of data. In some embodiments, a memory cell can include one or more memory pages (also referred to herein as "logical pages" or "pages," e.g. SLC, MLC, TLC, QLC pages) for storing one or more bits of binary data corresponding to data received from a host system. For some memory devices, such as NAND devices, blocks are the smallest area than can be erased and pages within the blocks cannot be erased individually. For some memory devices, such as NAND devices, pages are the smallest area that can be written to (e.g., programmed). In some embodiments, the memory sub-system 110 includes a memory sub-system controller 118 that performs operations as described herein.

In some embodiments, block record manager 113 of memory sub-system controller 118 performs the operations described herein. In some embodiments, any component of the memory sub-system 110 can include the memory sub-system controller 118. For example, the memory sub-system controller 118 can be part of host system 120, memory device 140, memory device 130, or an operating system (OS) (e.g., OS of host system 120). In another example, the memory sub-system controller 118 can include a processor 117 (processing device) configured to execute instructions stored in local memory 119 for performing the operations described herein. In some embodiments, memory sub-system controller 118 can include or access firmware (f/w) block record 115 and recently used entry table 122. In some embodiments, the memory device 130 can include or access device block record 137. Firmware block record 115, recently used entry table 122, and device block record 137 are further described with respect to FIG. 3A-3B.

In some embodiments, the memory operations can include but are not limited to a program operation (e.g., write operation), a read operation, or an erase operation. In some embodiments, a program operation can include multiple sub-operations such as a program sub-operation, a read sub-operation, and a verify sub-operation. A program sub-operation programs data to memory cells. The data to be programmed can also be stored in one or more registers of the memory device 130. The read operation reads the data programmed to the memory cells. The verify operation compares whether the read data from the read operation matches the original data stored in the registers.

A data unit can refer to a unit of data of a particular size. An example of a data unit is a block. In other embodiments, a data unit can be a different size. It can be noted that aspects of the disclosure are described with respect to a block of memory for purposes of illustration, rather than limitation. In other embodiments, aspects of the disclosure can be applied to a data unit. For example, a firmware data unit record and device data unit record can be implemented in a similar manner as a firmware block record 115 and device block record 137, as described herein.

Further details with respect to block record manager 113 are further described below. Components of FIG. 1 are used to help describe the following Figures.

Figure 2:
FIG. 2 is a diagram illustrating a page map used to describe an automated dynamic wordline start voltage (ADWLSV) operation used in a memory sub-system, in accordance with some embodiments of the disclosure.

FIG. 2 is a diagram illustrating a page map used to describe an automated dynamic wordline start voltage (ADWLSV) operation used at a memory sub-system, in accordance with some embodiments of the disclosure. Page map 200 illustrates a page map associated with a particular block of memory cells of a memory device 130. Page map 200 shows a simplified illustration of memory pages of a block of memory in a memory device, such as memory device 130. Page map 200 illustrates an order of programming pages of a block of memory cells. The page map 200 is provided to help illustrate an automated dynamic wordline start voltage (ADWLSV) operation that dynamically matches a wordline start voltage to the memory cells associated with the wordline throughout the lifetime of the memory device 130.

Page map 200 includes columns A-K and rows 1-7. As illustrated in row 1, the block of memory can be divided into multiple subblocks (sb), such as subblock 0 (sb 0), subblock 1 (sb 1), and subblock 2 (sb 2). As illustrated in column A, the block of memory includes 5 wordlines (wl), wordline 0-4. As illustrated in column B, each cell in a wordline is configured to store a particular number of bits. Wordline 0 is configured as SLC memory where each memory cell stores 1 bit in a lower page (LP). Wordline 2 is configured as MLC memory where each memory cell stores 2 bits, 1 bit in the lower page (LP) and 1 bit in the upper page (UP). Wordlines 5-7 are configured as TLC memory where each memory cell stores 3 bits, 1 bit in the lower page (LP), 1 bit in the upper page (UP), and 1 bit in the extra page (XP). Each of the cells in the cross section of columns C-K and rows 3-7 represent memory pages (e.g., logical pages). The numbers 0-37 in the cross section of columns C-K and rows 3-7 represent the order in which the memory pages are programmed starting with 0 and ending with 37.

As noted above, a wordline start voltage can refer to a start voltage (e.g., selected from a sequence of incrementing voltages) that is applied to a wordline for programming (e.g., performing a program operation) memory cells associated (e.g., coupled to the wordline) the wordline. In performing an ADWLSV operation, the memory device 130 can apply one or more of a sequence of incremented voltages to determine the lowest voltage (e.g., wordline start voltage) at which the first page of the wordline can be programmed with valid data. The other pages of the same wordline can be programmed by the wordline start voltage determined for the first page of the wordline. The programming time may be decreased by increasing the wordline start voltage to more closely match that of a first page of memory cells and by programming the remaining pages of the wordline using the same increased wordline start voltage. Determining an appropriate wordline start voltage for the first page of a wordline may allow lower wordline start voltages in the sequence of incremented voltages to be bypassed (e.g., skipped). Utilizing the increased wordline start voltage determined for the first page can enable utilizing fewer incremented voltages in the sequence of incremented voltages to determine an appropriate wordline start voltage for the other pages associated with the same wordline.

For example, wordline 0 includes page 0 (column E, row 3), page 1, (column H, row 3), and page 2 (column K, row 3). Memory device 130 can program pages in order from page 0 to page 37. In an ADWLSV operation for a single-plane program, memory device 130 can start a program operation at wordline 0 by programming page 0. Memory device 130 can start at a lowest program voltage of a sequence of incremented voltages to program data at page 0. After programming page 0, memory device 130 reads the data back from page 0, and verifies if the data stored at page 0 is valid. If the data is not valid, memory device 130 can increase the program voltage by a particular step size (e.g., $2^{nd}$ program voltage in the sequence of incremented voltages) and program data at page 0 using the $2^{nd}$ program voltage. Memory device 130 can read the data back from page 0, and verify if the data stored at page 0 is valid. This operation can be repeated until a program voltage for page 0 is found to program valid data. The program voltage that programs valid data is associated with page 0 and can be used as the wordline start voltage for the remaining pages of wordline 0. For instance, to program page 1 of wordline 0, memory device 130 starts at the stored wordline start voltage, rather than the lowest programming voltage, and repeats the above operations until page 1 is found to store valid data. Similarly, programming page 2 of wordline 0 can start with the wordline start voltage determined from page 0.

In some embodiments, a program operation does not write all the wordlines in a particular block, which leaves the particular block as an open block. An "open" block may refer to a physical block of memory cells where the pages of the block have not been completely written. In some embodiments, the block may remain open until a last page (e.g., page 37) of the block is programmed. The block is closed after the last page of block is programmed.

In some embodiments, the ADWLSV operation can be performed for a multi-plane program operation. In a multi-plane program operation, multiple planes of a die (or memory device 130) can be written in parallel (e.g., concurrently). The ADWLSV operation for a multi-plane program operation can be performed in similar manner as described above, but for the following differences. It can be noted that each block of die of a memory device 130 can have page maps that are the same as page map 200. So when different blocks of a multi-plane program operation are written, it is typical that the blocks of the multi-plane program operation are written in the same order.

In some embodiments, the ADWLSV operation for multi-plane write can determine the wordline start voltage for the first page of a wordline of each block in a similar manner as described above. The lowest wordline start voltage out of all the determined wordline start voltages for the multiple blocks is determined, and the lowest wordline start voltage is used as the wordline start voltage for all the corresponding wordlines in the multi-plane program operation.

Figure 3A:
FIG. 3A is a diagram illustrating an example of a firmware block list, a device block list, and a recently used entry table, in accordance with some embodiments of the disclosure.

FIG. 3A is a diagram illustrating an example of a firmware block list, a device block list, and a recently used entry table, in accordance with some embodiments of the disclosure.

Diagram 300 illustrates examples of firmware block record 115, device block record 137, and recently used entry table 122 as shown in FIG. 1. The device block record 137 is used by the memory device 130 to store wordline start voltages (e.g., ADWLSV) for multiple open blocks of a die of memory device 130. The device block record 137 can have a defined number of entries (e.g., 8 entries). Each entry can store a wordline start voltage for a particular block. The wordline start voltages recorded in entries of the device block record 137 can be used to program open blocks. When a block is closed, the entry for a particular block can be released and be made available for another block. In some embodiments and as noted above, memory sub-system controller 118 can create and maintain in parallel a firmware block record 115 that attempts to track the contents of the device block record 137. In some embodiments, the memory sub-system controller 118 does not have access to the contents of the device block record 137 stored at the memory device 130. For example, the memory sub-system controller 118 cannot read the contents of the device block record 137 or receive the contents of the device block record 137 from memory device 130.

In some embodiments, the device block record 137 is maintained by local media controller 135 of memory device 130. The device block record 137 can be stored in volatile memory that is associated and accessible by memory device 130. In some embodiments, each die of a memory device 130 can be associated with a respective device block record 137. In some embodiments, each entry of the device block record 137 can store wordline start voltage information. For example, each entry of the device block record 137 can identify one or more of a particular block (e.g., block per plane), the plane(s) on which the particular block is located (e.g., plane), the wordline of the particular block (e.g., wordline), and the determined wordline start voltage (ADWLSV) for the wordline. For example, entry 1 of device block record 137 shows that wordline 3 of block 0 plane 0 has a wordline start voltage of 12 Volts (V). It can be noted that all the blocks of the device block record 137 are different blocks of a particular die, and each entry stores a wordline start voltage for a particular wordline of a block.

In some embodiments, an entry of the device block record 137 is opened when the first page of a wordline is written. The wordline start voltage can be recorded in the entry. If the block that is written is a block that is not a block identified in the device block record 137, the memory device 130 can add a new entry (e.g., up to the defined number of entries). If the block that is written is a block that is already identified in the device block record 137, the entry for that particular block can be updated. The memory device 130 can close an entry of the device block record 137 when the last page (e.g., the last lower page) of the particular block is written. In some embodiments, when the last lower page of a wordline is written, the wordline start voltage can be stored as a flag byte at the memory device 130 and associated with the particular wordline. After storing the flag byte, the memory device 130 can start writing a new wordline in the same block. The old wordline start voltage information in the entry for the same block can be replaced by the new wordline start voltage information for the new wordline.

In some embodiments, the firmware block record 115 is maintained by memory sub-system controller 118. The firmware block record 115 can be stored in volatile memory that is associated and accessible by memory sub-system controller 118. The entries of firmware block record 115 correspond to entries of the device block record 137. For example, entry 1 of firmware block record 115 corresponds to entry 1 of device block record 137, and entry 2 of firmware block record 115 corresponds to entry 2 of device block record 137, and so forth.

In some embodiments, the firmware block record 115 can also store wordline start voltage information that corresponds to entries of the device block record 137. For example, each entry of the firmware block record 115 stores the particular block (e.g., block per plane) for which the wordline start voltage information is stored at the device block record 137. The firmware block record 115 also stores plane mask information. The plane mask of firmware block record 115 identifies the planes and the status of the blocks of those planes (e.g., good or bad). For example, in entry 1 the plane mask is 4b'0000. "4b'" identifies that 4 bits are used to describe the 4 planes. "0000" represent the planes and the status of the blocks for the planes. The least significant bit (LSB) (most right position) represents plane 0, the $2^{nd}$ LSB (second most right position) represents plane 1, the second most significant bit (MSB) (second most left position) represents plane 2, and the MSB (most left position) represents plane 3. In some embodiments, planes 0-3 can be planes of the same die. "0" represents a good block. "1" represents a bad block. A bad block is a block that is no longer used to store information. "0000" represents that all the blocks of plane 0-3 are good blocks. "0001" represents that blocks of plane 1-3 are good blocks, and block of plane 0 is a bad block.

The recently used entry table 122 keeps track of the recency of use of the entries of the firmware block record 115. For example, recently used entry table 122 of FIG. 3A shows entry 1 through entry 8 in decreasing recency of use, where entry 1 is the least recently used entry and entry 8 is the most recently used entry of firmware block record 115.

FIG. 3B is a diagram illustrating an example of an updated firmware block list, an updated device block list, and an updated recently used entry table, in accordance with some embodiments of the disclosure.

Diagram 350 illustrate firmware block record 115, device block record 137, and recently used entry table 122 after a new program operation has been requested on a new block that is not in the device block record 137 or firmware block record 115. In the current example, the device block record 137 was/is full. Memory sub-system controller 118 determines that an entry of the device block record 137 is to be removed. The memory sub-system controller 118 uses the recently used entry table 122 to determine the oldest entry of the firmware block record 115. The oldest entry is entry 1. The memory sub-system controller 118 sends a command to remove the corresponding entry 1 from the device block record 137. The program operation is performed and entry 1 of the device block record 137 is updated by the memory device 130 to record the new wordline start voltage information for the new block. The memory sub-system controller 118 updates a corresponding entry of firmware block record 115 to reflect the changes made to the device block record 137. Memory sub-system controller 118 also updates the recently used entry table 122 by making entry 1 the most recently used entry and shifting the other entries of the recently used entry table 122 accordingly. It can be noted that if firmware block record 115 were not implemented in the present example, an entry in device block record 137 would not be available for new wordline start voltage information, and the wordline start voltage would be determined for each page of the current wordline of the new block (e.g., and possibly each page of the new block).

FIGS. 4-8 help describe embodiments that illustrate management of the firmware block record 115 with respect to device block record 137. The methods 400, 500, 600, 700 and 800 of FIGS. 4-8, respectively, that are described below can be performed by processing logic that can include hardware (e.g., processing device, circuitry, dedicated logic, programmable logic, microcode, hardware of a device, integrated circuit, etc.), software (e.g., instructions run or executed on a processing device), or a combination thereof. In some embodiments, the method 400, 500, 600, 700 or 800 is performed by block record manager 113 of FIG. 1. Although shown in a particular sequence or order, unless otherwise specified, the sequence or order of the operations can be modified. Thus, the illustrated embodiments should be understood only as examples, and the illustrated processes can be performed in a different order, and some processes can be performed in parallel. Additionally, one or more processes can be omitted in various embodiments. Thus, not all processes are required in every embodiment. Other process flows are possible. In some embodiments, the same, different, greater, or fewer operations can be performed.

Figure 4:
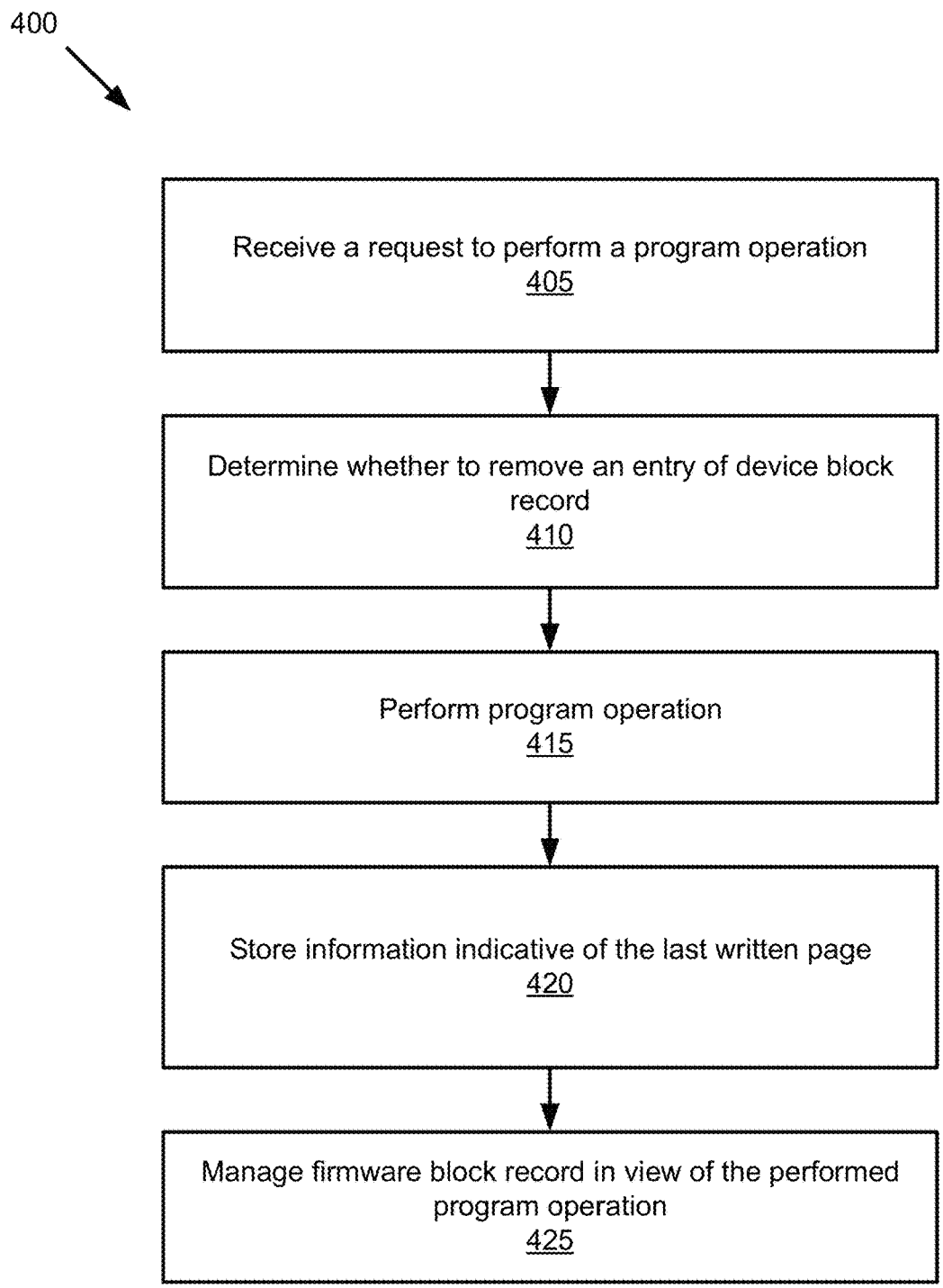
FIG. 4 is a flow diagram of an example method of managing the firmware block record and device block record, in accordance with embodiments of the disclosure.

FIG. 4 is a flow diagram of an example method of managing the firmware block record and device block record, in accordance with embodiments of the disclosure.

At operation 405, processing logic receives a request to perform a program operation. The program operation can be a multi-plane program operation or a single-plane program operation. In some embodiments, the request can be received from host system 120. In some embodiments, the request can identify one or more parameters such as, but not limited to, one or more block identifiers (e.g., identifies the block to be written), a plane mask, user data, and an identifier of one or more pages (e.g., page identifier(s)) of the identified block that are to be written (e.g., including the last page).

At operation 410, processing logic determines whether to remove an entry of the device block record 137. Determining whether to remove an entry of the device block record 137 is further described in method 500 of FIG. 5. It can be noted that if the processing logic determines to remove an entry of the device block record 137 or not to remove an entry of the device block record 137, in both scenarios processing logic proceeds to operation 415.

At operation 415, processing logic performs the program operation. In some embodiments, the program operation is multi-plane program operation. For example, memory sub-system controller 118 can initiate a multi-plane program operation at memory device 130.

At operation 420, processing logic stores information indicative of the last written page of the block. For example, the multi-plane write operation can write data up to and including page 20 of blocks 0-3 in a four-plane program operation. Processing logic can store the block address of page 20 for one or more block 0-3. The stored information of the last written page can be used, for example, for determining at which page (e.g., page 20) to start writing the next program operation. In some embodiments, the stored information can be used in operations as described in FIG. 8A-8B.

At operation 425, processing logic manages the firmware block record 115 in view of the performed program operation. Processing logic manages the firmware block record to reflect the changes to the device block record 137 caused by the performance of the program operation. Managing the firmware block record 115 is further described in method 600 of FIG. 6.

Figure 5:
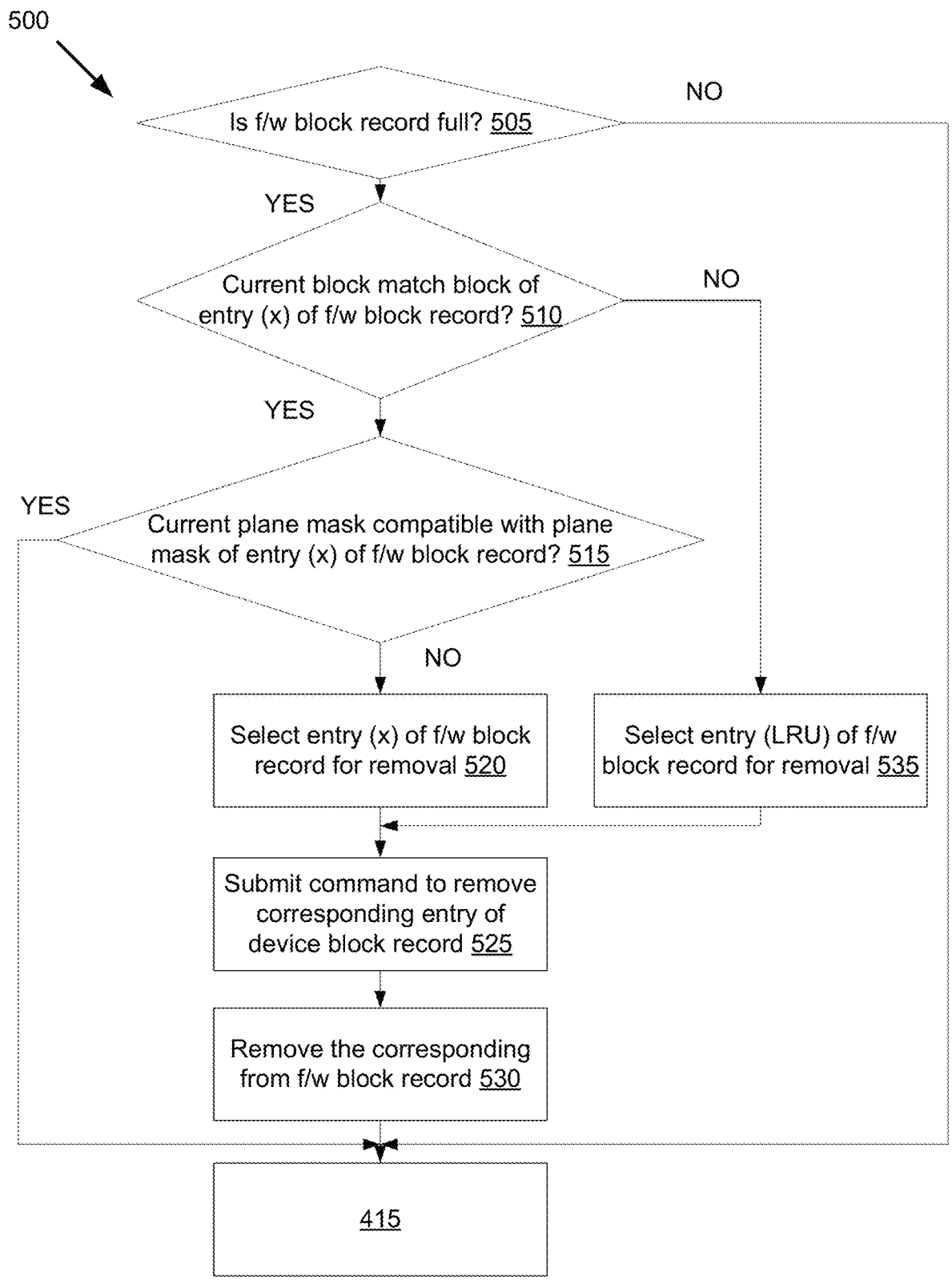
FIG. 5 is a flow diagram of an example method of determining whether to remove an entry of the device block record, in accordance with embodiments of the disclosure.

FIG. 5 is a flow diagram of an example method of determining whether to remove an entry of the device block record, in accordance with embodiments of the disclosure.

At operation 505, processing logic performing method 500 determines whether the firmware block record 115 is full. For example, if the firmware block record 115 has only 8 entries, processing logic can determine whether all 8 entries are storing information or there are available entries in the firmware block record 115.

In embodiments, if the firmware block record 115 is not full, processing logic proceeds to operation 415 of method 400. For instance, firmware block record 115 having available entries indicates that the device block record 137 also has available entries. If the device block record 137 has available entries, memory device 130 can store wordline start voltage information in an available entry of the device block record 137 and the memory sub-system controller 118 does not remove an entry from the device block record 137. If the device block record 137 does not have available entries, memory sub-system controller 118 may remove an entry of the device block record 137 contingent on operations of method 500 as described below. If the device block record 137 does not have available entries (e.g., the device block record 137 is full), processing logic proceeds to operation 510.

At operation 510, processing logic determines whether the current block matches a block of any entry of the firmware block record 115. In an illustrative example, memory sub-system controller 118 knows the block(s) to which the data of the program operation is to be written.

In embodiments, processing logic can check the firmware block record 115 to determine whether any block(s) that are to be written are identified in any entry of the firmware block record 115. If the block(s) to be written is not identified in any entry of the firmware block record 115, processing logic proceeds to operation 535 where an entry of the firmware block record 115 is removed. It can be noted that if the firmware block record 115 is full and the block to be written does not match any block in any entry of the firmware block record 115, an entry of the firmware block record 115 is to be removed and a corresponding entry of the device block record 137 is also removed to make room for the new wordline start voltage information associated with the current program operation. If the block(s) to be written is identified in an entry of the firmware block record 115, processing logic proceeds to operation 515.

At operation 515, processing logic determines whether the current plane mask is compatible with the plane mask of the determined entry (e.g., determined in operation 510) of the firmware block record 115. The current plane mask can be the plane mask associated with the current program operation. The plane mask can identify the planes that are to be written by the program operation. To match the current plane mask to the plane mask of the determined entry to the firmware block record 115, the number of good blocks of the current plane mask are to equal the number of good blocks of the plane mask of the determined entry irrespective of which blocks (on which plane) are good.

For example, current plane mask 4b'0000 is compatible with the plane mask 4b'000 of the determined entry of the firmware block record 115. Current plane mask 4b'1100 is compatible with the plane mask 4b'0011 of the determined entry of the firmware block record 115. Plane masks 4b'1110, 4b'1101, 4b'1011, and 4b'0111 are all compatible with one another. Plane masks 4b'0000 and 4b'1000 are not compatible.

If the current plane mask is compatible with the plane mask of the determined entry of the firmware block record 115, processing logic proceeds to operation 415. It can be noted that conditions of operation 505, 510, and 515 are met, then memory sub-system controller 118 can assume that the memory device 130 will successfully update an entry of the device block record 137 to include the wordline start voltage of the current program operation.

If the current plane mask is not compatible with the plane mask of the determined entry of the firmware block record 115, processing logic proceeds to operation 520.

At operation 520, processing logic selects the determined entry (e.g., determined at operation 510) of the firmware block record 115 for removal.

Returning to operation 535, processing logic selects the least recently used (e.g., oldest) entry from the firmware block record 115 to remove. In some embodiments, processing logic can use recently used entry table 122 to determine the entry that is least recently used.

At operation 525, processing logic submits a command to memory device 130 to remove a corresponding entry of the device block record 137. The corresponding entry of device block record 137 can be the entry that corresponds to the determined entry (e.g., operation 510) if the operation 520 precedes operation 525, or the least recently used entry (e.g., operation 535) if the operation 535 precedes operation 525. In some embodiments, the command sent to memory device 130 causes memory device 130 to remove the corresponding entry from the device block record 137.

At operation 530, processing logic removes the corresponding entry from the firmware block record 115. The corresponding entry can be the entry that was selected at either operation 520 or operation 535. The corresponding entry of firmware block record 115 can be the entry that corresponds to the determined entry (e.g., operation 510) if the operation 520 precedes operation 530, or the least recently used entry (e.g., operation 535) if the operation 535 precedes operation 530.

Figure 6:
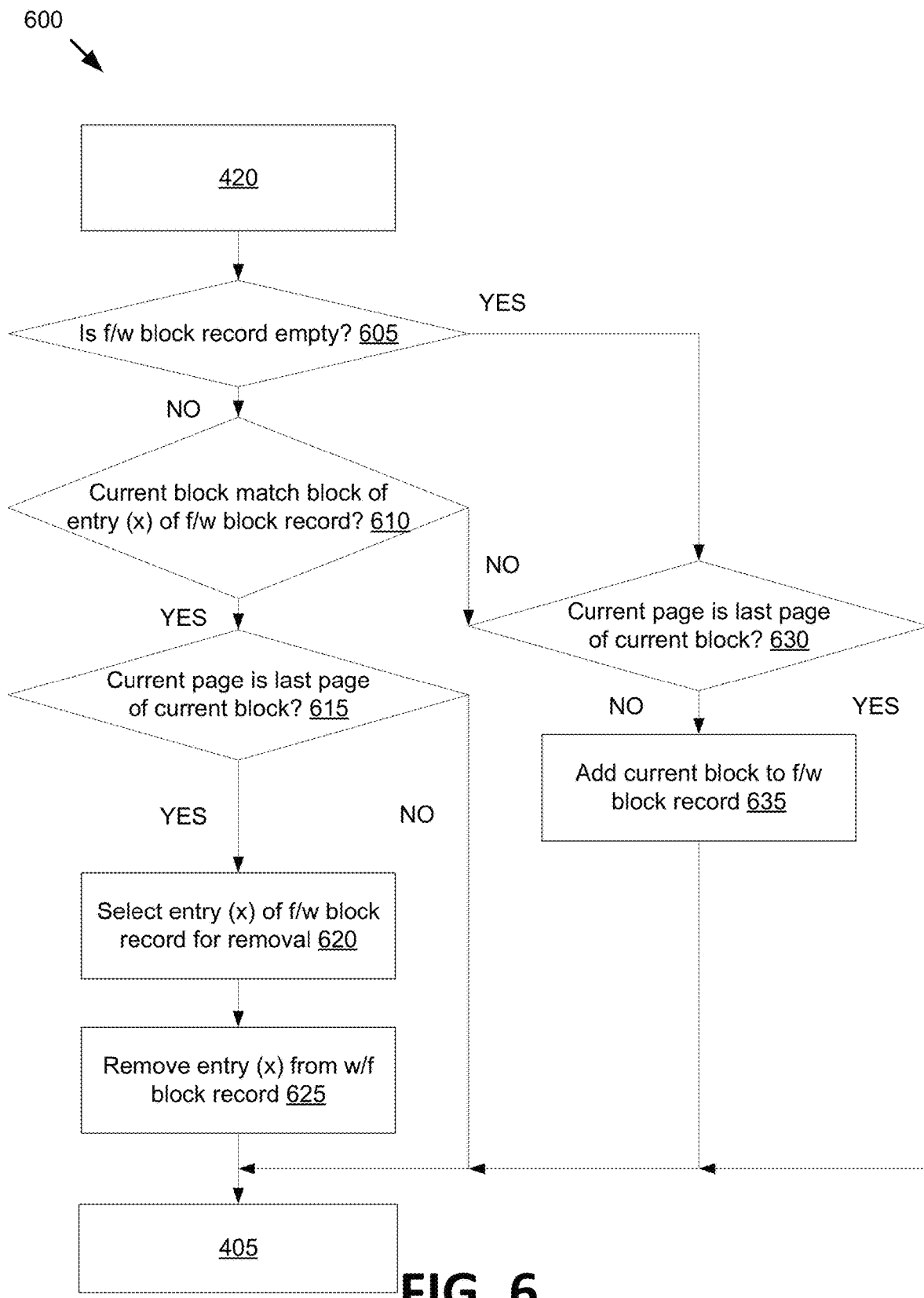
FIG. 6 is a flow diagram of an example method of managing the firmware block record in view of the performed program operation, in accordance with embodiments of the disclosure.

FIG. 6 is a flow diagram of an example method of managing the firmware block record in view of the performed program operation, in accordance with embodiments of the disclosure.

At operation 605, processing logic determines whether the firmware block record 115 is empty (e.g., does not contain any entries). If the firmware block record 115 is empty, processing logic proceeds to operation 630. If the firmware block record 115 is not empty, processing logic proceeds to operation 610.

At operation 610, processing logic determines whether the current block (e.g., of the current program operation) matches any block of the firmware block record 115. Operation 510 of method 500 is similar to operation 610 and can be used to help illustrate operation 610. If the current block does not match any block of the firmware block record 115, processing logic proceeds to operation 630. If the current block matches any block of the firmware block record 115, processing logic proceeds to operation 615.

At operation 615, processing logic determines whether the current page is the last page of the current block. The current page can refer to last written page of the current program operation. If the current page is the last page of the current block, the current block has been closed. If the current page is not the last page of the current block, processing logic proceeds to operation 405 (e.g., receives a new request to perform a program operation). If the current page is the last page of the current block, processing logic proceeds to operation 615.

At operation 620, processing logic selects the determined entry (e.g., determined at operation 610) of the firmware block record 115 for removal from the firmware block record 115. Operation 620 can be similar to operation 520 of method 500. Operation 520 can help illustrate operation 620.

At operation 625, processing logic removes the determined entry from the firmware block record 115.

At operation 630, processing logic determines whether the current page is the last page of the current block. Operation 630 is similar to operation 615. Operation 615 can help illustrate operation 630. If the current page is the last page of the current block, processing logic proceeds to operation 405. If the current page is not the last page of the current block, processing logic can proceed to operation 635.

At operation 635, processing logic adds the current block to the firmware block record 115. For example, a new entry can be created for the current block that identifies the current block and the plane mask of the current program operation.

It can be noted that operation 405 refers to receiving a new program operation such that the operations of method 400 can be repeated in view of the new program operation.

Figure 7:
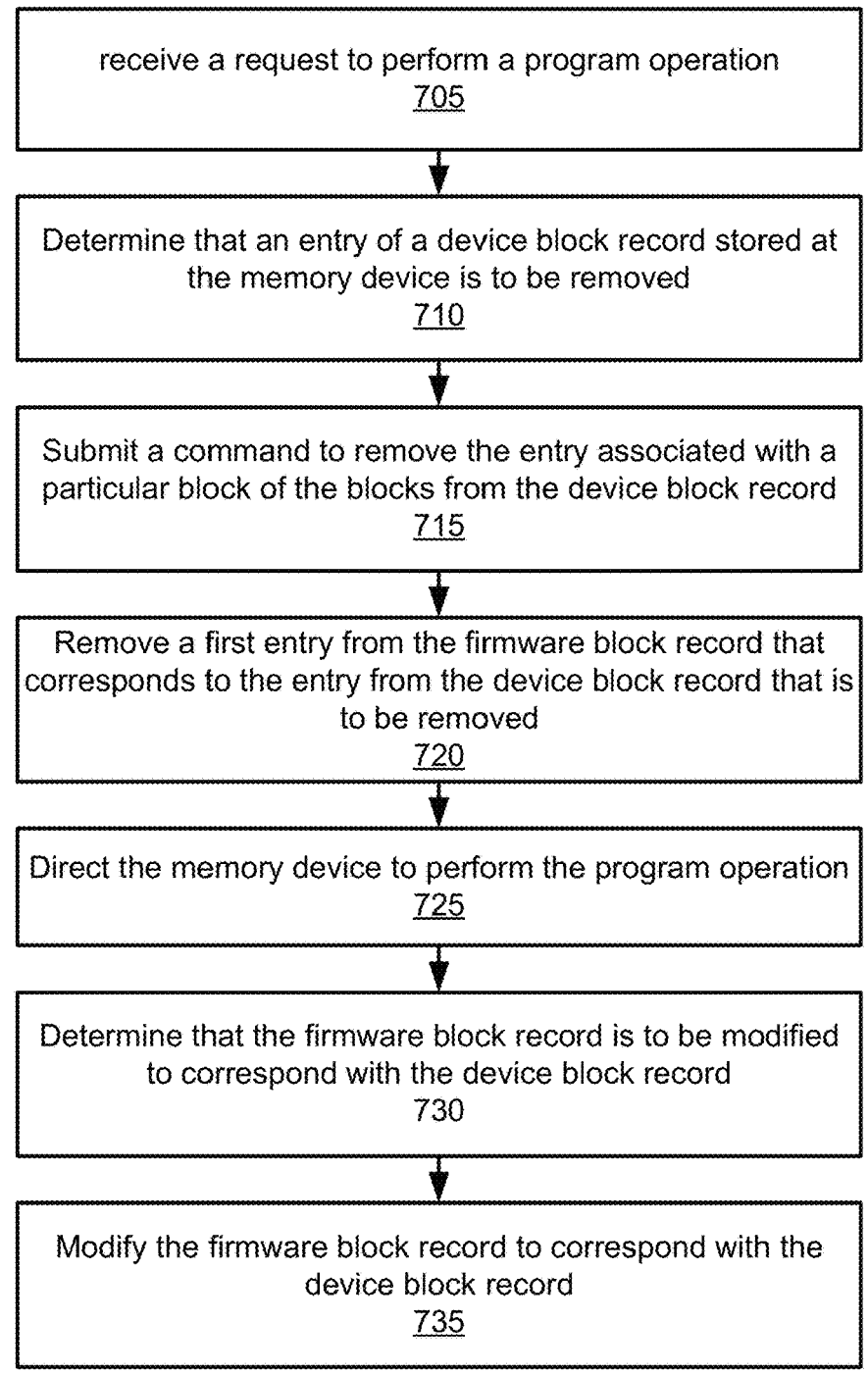
FIG. 7 is a flow diagram of an example method of managing the firmware block record and the device block record, in accordance with embodiments of the disclosure.

FIG. 7 is a flow diagram of an example method of managing the firmware block record and the device block record, in accordance with embodiments of the disclosure.

At operation 705, processing logic performing method 700 receives a request to perform a program operation. The program operation can be an operation that writes data at the memory device 130.

At operation 710, processing logic determines that an entry of a device block record stored at the memory device is to be removed. In some embodiments, the determination is based on parameters associated with the program operation and a firmware block record that corresponds to the device block record. The firmware block record tracks the entries of the device block record. The entries of the device block record are associated with blocks of the memory device and identify start voltages that are applied to wordlines of the blocks to program memory cells associated with the wordlines.

In some embodiments, the parameters associated with the program operation include one or more block identifiers and a plane mask. To determine that the entry of the device block record stored at the memory device is to be removed based on the parameters associated with the program operation and the firmware block record, processing logic determines whether a number of entries of the firmware block record satisfies a threshold number of entries (e.g., the firmware block record 115 is full so that the threshold number of entries is the maximum number of entries of the firmware block record 115). Responsive to determining that the number of entries of the firmware block record satisfies the threshold number of entries, processing logic determines whether the one or more block identifiers that are associated with blocks of the memory device that are to be programmed by the program operation correspond to any entries of the firmware block record (e.g., current block match any entry of the firmware block record 115). Responsive to determining that at least one of the block identifiers correspond to a fourth entry of the firmware block record, processing logic determines that the plane mask associated with the program operation is compatible with a plane mask associated with the fourth entry of the firmware block record. The fourth entry of the firmware block record corresponds to the entry of the device block record that is to be removed.

In some embodiments, contents of the entries of the device block record stored at the memory device are unavailable to be read by the memory sub-system controller.

At operation 715, processing logic submits a command to remove the entry associated with a particular block of the blocks from the device block record. The command can be submitted to the memory device 130. Removing the entry can make a space available at the device block record for a new entry associated with a new block that is to written in view of the program operation.

At operation 720, processing logic removes a first entry from the firmware block record that corresponds to the entry from the device block record that is to be removed.

At operation 725, processing logic directs the memory device to perform the program operation.

At operation 730, processing logic determines that the firmware block record is to be modified to correspond with the device block record. The determination can be based on the parameters associated with the program operation and the firmware block record.

At operation 735, processing logic modifies the firmware block record to correspond with the device block record. Processing logic modifies the firmware block record so that the changes to the device block record resulting from performing the program operation are reflected at the firmware block record. In some embodiments, to modify the firmware block record to correspond with the device block record, processing logic performs one of removing a second entry from the firmware block record or adding a third entry to the firmware block record.

Figure 8A:
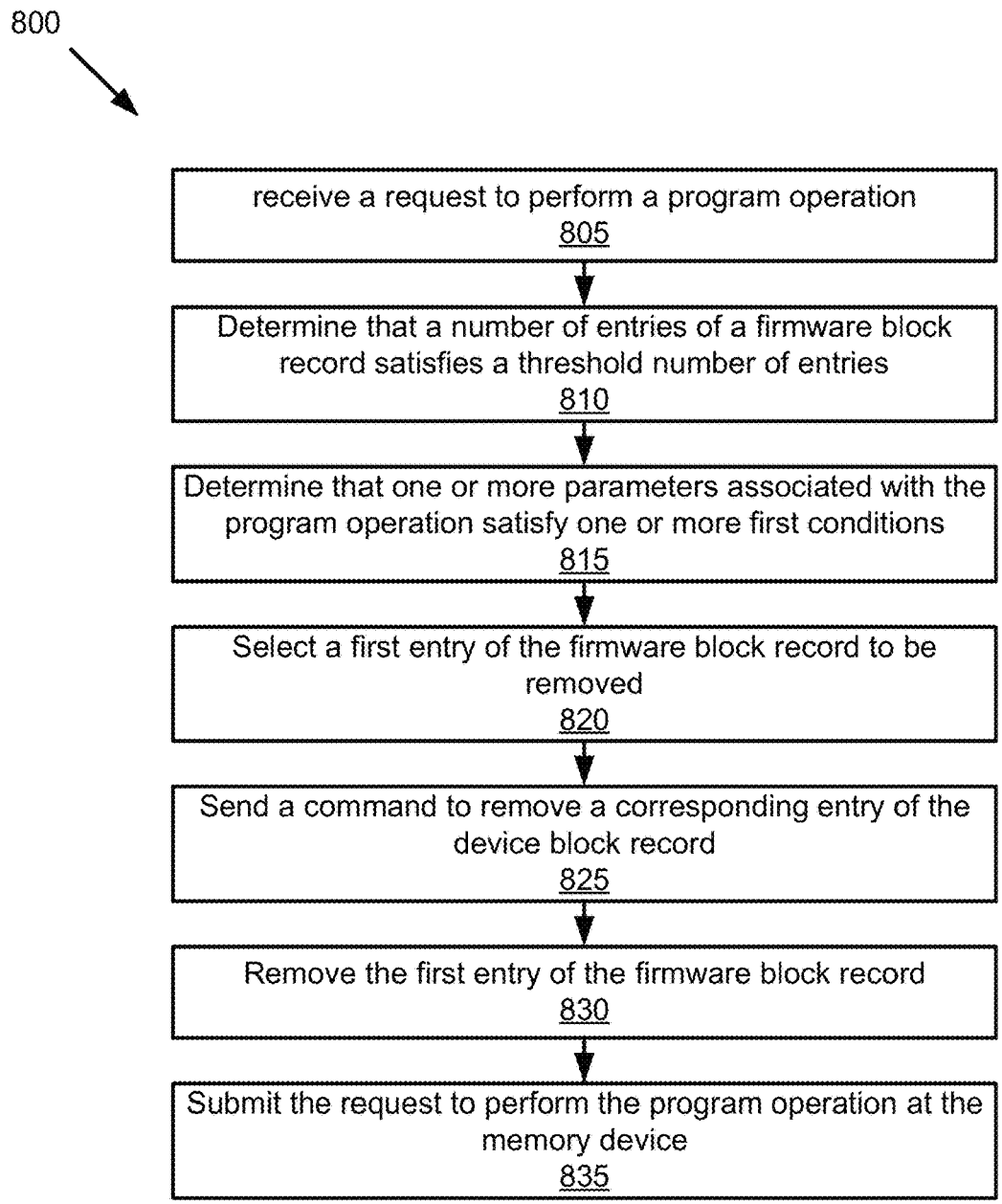
FIG. 8A-8B is a flow diagram of an example method of managing the firmware block record and the device block record, in accordance with embodiments of the disclosure.
Figure 8B:
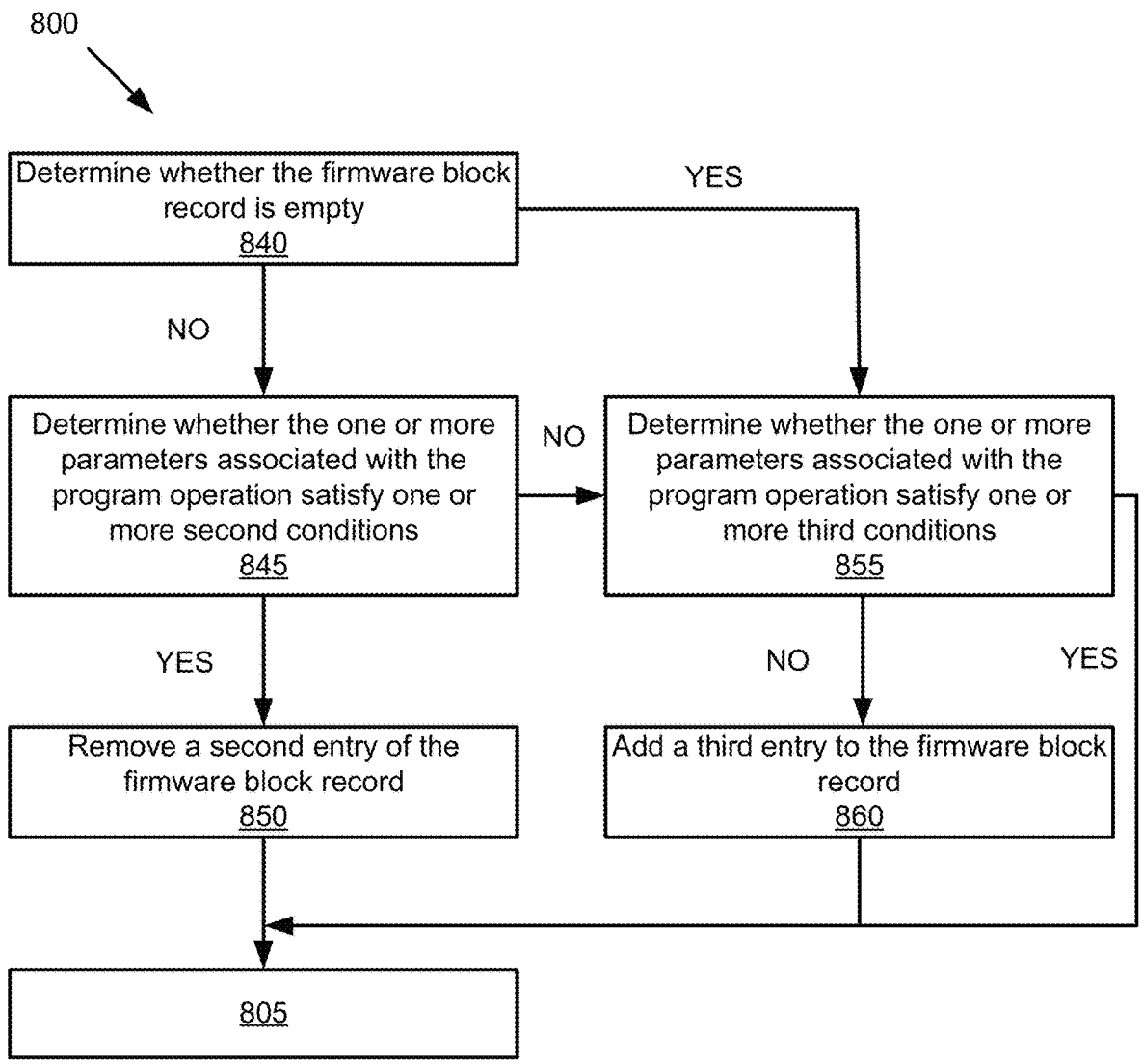

FIG. 8A-8B is a flow diagram of an example method of managing the firmware block record and the device block record, in accordance with embodiments of the disclosure.

At operation 805, processing logic performing method 800, receives a request to perform a program operation.

At operation 810, processing logic determines that a number of entries of a firmware block record satisfies a threshold number of entries (e.g., the maximum number of entries). The firmware block record tracks entries of a device block record stored at the memory device. The entries of the device block record identify start voltages that are applied to wordlines of blocks of the memory device to program memory cells of the wordlines.

At operation 815, processing logic determines that one or more parameters associated with the program operation satisfy one or more first conditions. Parameters are further described at least with respect to method 400 of FIG. 4. The determination can be responsive to determining that the number of entries satisfies the threshold number of entries. The one or more first conditions can include, but are not limited to, determining that current block matches any block of any entry of the firmware block record 115. The condition is satisfied if the current block matches any block of any entry of the firmware block record 115. The one or more first conditions can include, but are not limited to, determining if the current plane mask is compatible with the plane mask of the determined entry (e.g., entry of firmware block record 115 that matches current block of program operation) of the firmware block record 115. The condition is satisfied if the current plane mask is not compatible with the plane mask of the determined entry.

In some embodiments, the parameters associated with the program operation include one or more block identifiers and a plane mask. To determine whether one or more of the parameters associated with the program operation satisfy one or more first conditions that correspond to a firmware block record, processing logic determines whether a number of entries of the firmware block record satisfies a threshold number of entries. Responsive to determining that the number of entries of the firmware block record satisfies the threshold number of entries, processing logic determines whether the one or more block identifiers that are associated with blocks that are to be programmed by the program operation correspond to any entries of the firmware block record. Responsive to determining that at least one of the block identifiers correspond to a fourth entry of the firmware block record, processing logic determines that the plane mask associated with the program operation is compatible with a plane mask associated with the fourth entry of the firmware block record. The fourth entry of the firmware block record corresponds to the entry of the device block record that is to be removed.

At operation 820, processing logic selects a first entry of the firmware block record to be removed. Operation 820 can be performed responsive to determining that one or more of the first conditions has been satisfied.

At operation 825, processing logic sends a command to remove a corresponding entry of the device block record. Operation 825 can be performed responsive to determining that one or more of the first conditions has been satisfied.

At operation 830, processing logic removes the first entry of the firmware block record. Operation 830 can be performed responsive to determining that one or more of the first conditions has been satisfied.

At operation 835, processing logic submits the request to perform the program operation at the memory device.

At operation 840, processing logic determines whether the firmware block record is empty. If processing logic determines that the firmware block record is empty, processing logic proceeds to operation 855. If processing logic determines that the firmware block record is not empty, processing logic proceeds to operation 845.

At operation 845, processing logic determines whether the one or more parameters associated with the program operation satisfy one or more second conditions. The one or more second conditions can include, but are not limited to, determining if the current block matches the any block of any entry of the firmware block record. Satisfaction of the condition includes determining that the current block matches an entry of the firmware block record. Another of the one or more second conditions can include, but is not limited to, determining whether the current page is the last page of the current block. Satisfaction of the condition includes determining that the current page is the last page of the current block. If processing logic does not satisfy one or more of the second conditions, processing logic proceeds to operation 855. If processing logic does satisfy one or more of the second conditions, processing logic proceeds to operation 850.

In some embodiments, the parameters associated with the program operation include one or more block identifiers and a page identifier. To determine whether the one or more parameters associated with the program operation satisfy the one or more second conditions, processing logic determines whether the one or more block identifiers that are associated with blocks that are to be programmed by the program operation correspond to any entries of the firmware block record. Responsive to determining that at least one of the one or more block identifiers correspond to the second entry of the firmware block record, processing logic determines whether the page identifier corresponds to a last page of a particular one of the blocks of the memory device that are to be programmed. The second entry of the firmware block record is removed if the page identifier corresponds to the last page.

At operation 850, processing logic remove a second entry of the firmware block record.

At operation 855, processing logic determines whether the one or more parameters associated with the program operation satisfy one or more third conditions. The one or more third conditions can include, but are not limited to, determining whether the current page is the last page on the current block. Satisfaction of the condition includes determining that the current page is the last page of the current block. If processing logic satisfies the one or more of the third conditions, processing logic proceeds to operation 805. If processing logic does not satisfy one or more of the third conditions, processing logic proceeds to operation 860.

In some embodiment, the parameters associated with the program operation include a page identifier. To determine whether the one or more parameters associated with the program operation satisfy one or more third conditions, processing logic determines whether the page identifier corresponds to a last page of a particular one of the blocks of the memory device that are to be programmed, wherein the third entry of the firmware block record is added if the page identifier corresponds to the last page.

At operation 860, processing logic adds a third entry to the firmware block record. In some embodiments, the third entry is the current block and information thereof.

Figure 9:
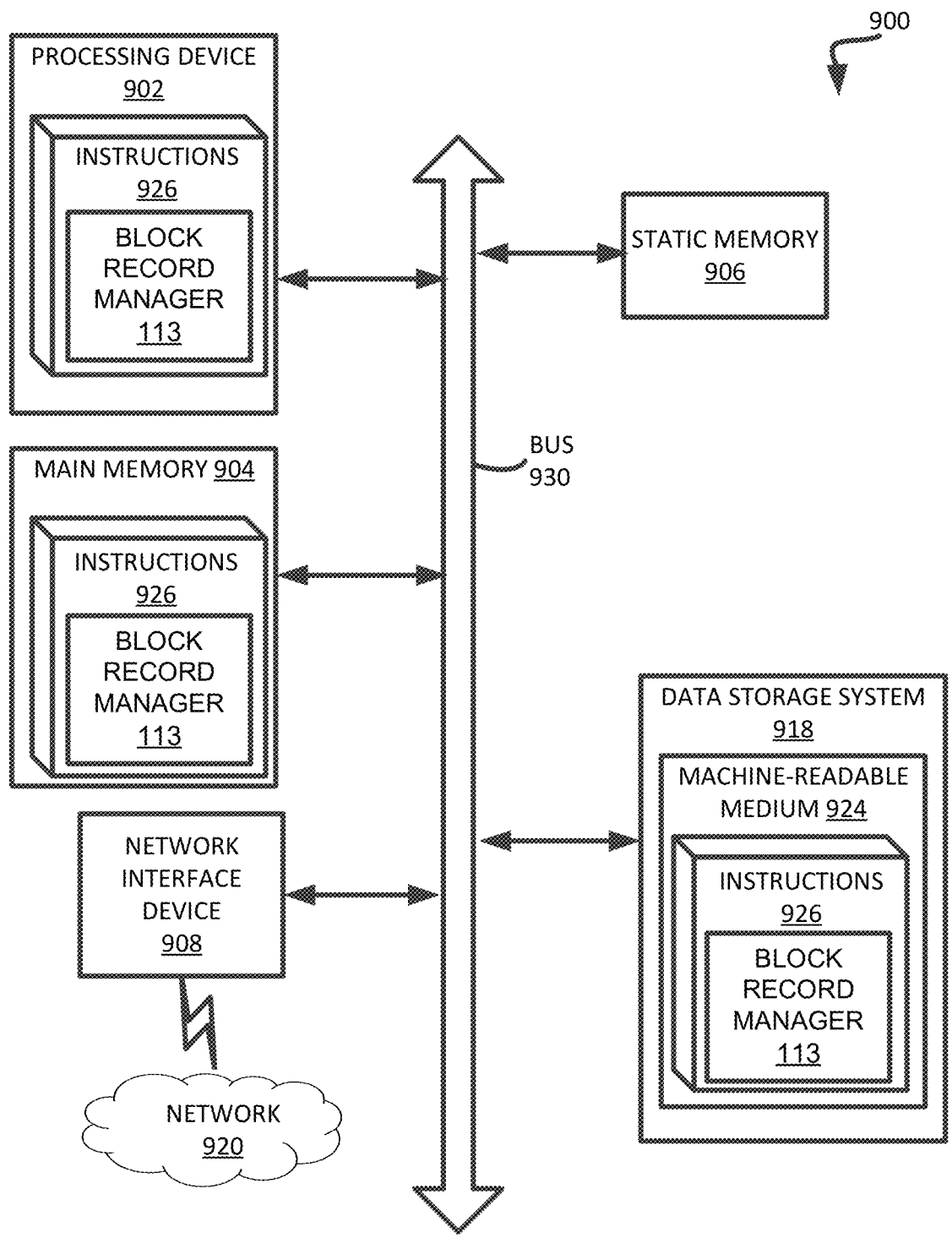
FIG. 9 is a block diagram of an example computer system in which embodiments of the present disclosure may operate.

FIG. 9 illustrates an example machine of a computer system 900 within which a set of instructions, for causing the machine to perform any one or more of the methodologies discussed herein, can be executed. In some embodiments, the computer system 900 can correspond to a host system (e.g., the host system 120 of FIG. 1) that includes, is coupled to, or utilizes a memory sub-system (e.g., the memory sub-system 110 of FIG. 1) or can be used to perform the operations of a controller (e.g., to execute an operating system to perform operations corresponding to block record manager 113 of FIG. 1). In alternative embodiments, the machine can be connected (e.g., networked) to other machines in a LAN, an intranet, an extranet, and/or the Internet. The machine can operate in the capacity of a server or a client machine in client-server network environment, as a peer machine in a peer-to-peer (or distributed) network environment, or as a server or a client machine in a cloud computing infrastructure or environment.

The machine can be a personal computer (PC), a tablet PC, a set-top box (STB), a Personal Digital Assistant (PDA), a cellular telephone, a web appliance, a server, a network router, a switch or bridge, or any machine capable of executing a set of instructions (sequential or otherwise) that specify actions to be taken by that machine. Further, while a single machine is illustrated, the term "machine" shall also be taken to include any collection of machines that individually or jointly execute a set (or multiple sets) of instructions to perform any one or more of the methodologies discussed herein.

The example computer system 900 includes a processing device 902, a main memory 904 (e.g., read-only memory (ROM), flash memory, dynamic random access memory (DRAM) such as synchronous DRAM (SDRAM) or Rambus DRAM (RDRAM), etc.), a static memory 906 (e.g., flash memory, static random access memory (SRAM), etc.), and a data storage system 918, which communicate with each other via a bus 930.

Processing device 902 represents one or more general-purpose processing devices such as a microprocessor, a central processing unit, or the like. More particularly, the processing device can be a complex instruction set computing (CISC) microprocessor, reduced instruction set computing (RISC) microprocessor, very long instruction word (VLIW) microprocessor, or a processor implementing other instruction sets, or processors implementing a combination of instruction sets. Processing device 902 can also be one or more special-purpose processing devices such as an application specific integrated circuit (ASIC), a field programmable gate array (FPGA), a digital signal processor (DSP), network processor, or the like. The processing device 902 is configured to execute instructions 926 for performing the operations and steps discussed herein. The computer system 900 can further include a network interface device 908 to communicate over the network 920.

The data storage system 918 can include a machine-readable storage medium 924 (also known as a computer-readable medium) on which is stored one or more sets of instructions 926 or software embodying any one or more of the methodologies or functions described herein. The instructions 926 can also reside, completely or at least partially, within the main memory 904 and/or within the processing device 902 during execution thereof by the computer system 900, the main memory 904 and the processing device 902 also constituting machine-readable storage media. The machine-readable storage medium 924, data storage system 918, and/or main memory 904 can correspond to the memory sub-system 110 of FIG. 1.

In one embodiment, the instructions 926 include instructions to implement functionality corresponding to block record manager 113 of FIG. 1. While the machine-readable storage medium 924 is shown in an example embodiment to be a single medium, the term "machine-readable storage medium" should be taken to include a single medium or multiple media that store the one or more sets of instructions. The term "machine-readable storage medium" shall also be taken to include any medium that is capable of storing or encoding a set of instructions for execution by the machine and that cause the machine to perform any one or more of the methodologies of the present disclosure. The term "machine-readable storage medium" shall accordingly be taken to include, but not be limited to, solid-state memories, optical media, and magnetic media.

Some portions of the preceding detailed descriptions have been presented in terms of algorithms and symbolic representations of operations on data bits within a computer memory. These algorithmic descriptions and representations are the ways used by those skilled in the data processing arts to most effectively convey the substance of their work to others skilled in the art. An algorithm is here, and generally, conceived to be a self-consistent sequence of operations leading to a desired result. The operations are those requiring physical manipulations of physical quantities. Usually, though not necessarily, these quantities take the form of electrical or magnetic signals capable of being stored, combined, compared, and otherwise manipulated. It has proven convenient at times, principally for reasons of common usage, to refer to these signals as bits, values, elements, symbols, characters, terms, numbers, or the like.

It should be borne in mind, however, that all of these and similar terms are to be associated with the appropriate physical quantities and are merely convenient labels applied to these quantities. The present disclosure can refer to the action and processes of a computer system, or similar electronic computing device, that manipulates and transforms data represented as physical (electronic) quantities within the computer system's registers and memories into other data similarly represented as physical quantities within the computer system memories or registers or other such information storage systems.

The present disclosure also relates to an apparatus for performing the operations herein. This apparatus can be specially constructed for the intended purposes, or it can include a general purpose computer selectively activated or reconfigured by a computer program stored in the computer. Such a computer program can be stored in a computer readable storage medium, such as, but not limited to, any type of disk including floppy disks, optical disks, CD-ROMs, and magnetic-optical disks, read-only memories (ROMs), random access memories (RAMs), EPROMs, EEPROMs, magnetic or optical cards, or any type of media suitable for storing electronic instructions, each coupled to a computer system bus.

The algorithms and displays presented herein are not inherently related to any particular computer or other apparatus. Various general purpose systems can be used with programs in accordance with the teachings herein, or it can prove convenient to construct a more specialized apparatus to perform the method. The structure for a variety of these systems will appear as set forth in the description below. In addition, the present disclosure is not described with reference to any particular programming language. It will be appreciated that a variety of programming languages can be used to implement the teachings of the disclosure as described herein.

The present disclosure can be provided as a computer program product, or software, that can include a machine-readable medium having stored thereon instructions, which can be used to program a computer system (or other electronic devices) to perform a process according to the present disclosure. A machine-readable medium includes any mechanism for storing information in a form readable by a machine (e.g., a computer). In some embodiments, a machine-readable (e.g., computer-readable) medium includes a machine (e.g., a computer) readable storage medium such as a read only memory ("ROM"), random access memory ("RAM"), magnetic disk storage media, optical storage media, flash memory components, etc.

The words "example" or "exemplary" are used herein to mean serving as an example, instance, or illustration. Any aspect or design described herein as "example" or "exemplary" is not necessarily to be construed as preferred or advantageous over other aspects or designs. Rather, use of the words "example" or "exemplary" is intended to present concepts in a concrete fashion. As used in this application, the term "or" is intended to mean an inclusive "or" rather than an exclusive "or." That is, unless specified otherwise, or clear from context, "X includes A or B" is intended to mean any of the natural inclusive permutations. That is, if X includes A; X includes B; or X includes both A and B, then "X includes A or B" is satisfied under any of the foregoing instances. In addition, the articles "a" and "an" as used in this application and the appended claims may generally be construed to mean "one or more" unless specified otherwise or clear from context to be directed to a singular form. Moreover, use of the term "an implementation" or "one implementation" or "an embodiment" or "one embodiment" or the like throughout is not intended to mean the same implementation or implementation unless described as such. One or more implementations or embodiments described herein may be combined in a particular implementation or embodiment. The terms "first," "second," "third," "fourth," etc. as used herein are meant as labels to distinguish among different elements and may not necessarily have an ordinal meaning according to their numerical designation.

In the foregoing specification, embodiments of the disclosure have been described with reference to specific example embodiments thereof. It will be evident that various modifications can be made thereto without departing from the broader spirit and scope of embodiments of the disclosure as set forth in the following claims. The specification and drawings are, accordingly, to be regarded in an illustrative sense rather than a restrictive sense.

What is claimed is:

1. A system comprising:
a memory device; and
a processing device, operatively coupled to the memory device, to perform operations comprising:
receiving a request to perform a program operation at the memory device;
determining whether a firmware block record is to be modified to correspond with a device block record based on parameters associated with the program operation, wherein the firmware block record tracks a plurality of entries of the device block record, and wherein at least some content of the plurality of entries of the device block record is inaccessible to the processing device; and
responsive to determining that the firmware block record is to be modified, modifying the firmware block record to correspond with the device block record.

2. The system of claim 1, wherein determining whether the firmware block record is to be modified to correspond with the device block record based on the parameters associated with the program operation, the processing device to perform the operations comprising:
determining that a number of entries of the firmware block record satisfies a threshold number of entries; and
responsive to determining that the number of entries satisfies the threshold number of entries, determining that one or more of the parameters associated with the program operation satisfy one or more first conditions that correspond to the firmware block record.

3. The system of claim 2, wherein modifying the firmware block record to correspond with the device block record responsive to determining that the firmware block record is to be modified, the processing device to perform the operations comprising:
responsive to satisfying the one or more first conditions, selecting a first entry of the firmware block record to be removed; and
removing the first entry of the firmware block record.

4. The system of claim 3, the processing device to perform the operations comprising:
responsive to satisfying the one or more first conditions, sending a command to remove a corresponding entry of the plurality of entries of the device block record at the memory device.

5. The system of claim 3, wherein the parameters associated with the program operation comprise one or more block identifiers and a plane mask, wherein determining whether one or more of the parameters associated with the program operation satisfy the one or more first conditions that correspond to the firmware block record, the processing device to perform the operations comprising:
determining whether the number of entries of the firmware block record satisfies the threshold number of entries.

6. The system of claim 5, the processing device to perform the operations comprising:
responsive to determining that the number of entries of the firmware block record satisfies the threshold number of entries, determining whether the one or more block identifiers that are associated with blocks of the memory device that are to be programmed by the program operation correspond to any entries of the firmware block record.

7. The system of claim 6, the processing device to perform the operations comprising:
responsive to determining that at least one of the block identifiers correspond to a fourth entry of the firmware block record, determining that the plane mask associated with the program operation is compatible with a plane mask associated with the fourth entry of the firmware block record, wherein the fourth entry of the firmware block record corresponds to the entry of the device block record that is to be removed.

8. The system of claim 1, the processing device is further to perform the operations comprising:
submitting the request to perform the program operation at the memory device;
wherein determining whether the firmware block record is to be modified to correspond with the device block record, the processing device to perform the operations comprising:
determining whether the firmware block record is empty, and
responsive to determining that the firmware block record is not empty, determining whether one or more of the parameters associated with the program operation satisfy one or more second conditions; and
wherein modifying the firmware block record to correspond with the device block record, the processing device to perform the operations comprising:
responsive to determining that the one or more parameters satisfy the one or more second conditions, removing a second entry of the firmware block record.

9. The system of claim 8, wherein determining whether the firmware block record is to be modified to correspond with the device block record, the processing device to perform the operations comprising:
responsive to determining that the firmware block record is empty, determining whether the one or more parameters associated with the program operation satisfy one or more third conditions; and
wherein modifying the firmware block record to correspond with the device block record, the processing device to perform the operations comprising:
responsive to determining that the one or more parameters do not satisfy the one or more third conditions, adding a third entry to the firmware block record.

10. The system of claim 9, wherein the parameters associated with the program operation comprise a page identifier, wherein determining whether the one or more parameters associated with the program operation satisfy the one or more third conditions, the processing device to perform the operations comprising:
determining whether the page identifier corresponds to a last page of a particular one of blocks of the memory device that are to be programmed, wherein the third entry of the firmware block record is added if the page identifier corresponds to the last page.

11. The system of claim 8, wherein the parameters associated with the program operation comprise one or more block identifiers and a page identifier, wherein determining whether the one or more parameters associated with the program operation satisfy the one or more second conditions, the processing device to perform the operations comprising:
  determining whether the one or more block identifiers that are associated with blocks of the memory device that are to be programmed by the program operation correspond to any entries of the firmware block record; and
  responsive to determining that at least one of the one or more block identifiers correspond to the second entry of the firmware block record, determining whether the page identifier corresponds to a last page of a particular one of the blocks of the memory device that are to be programmed, wherein the second entry of the firmware block record is removed if the page identifier corresponds to the last page.

12. A method comprising:
  receiving, by a processing device, a request to perform a program operation at a memory device;
  determining whether a firmware block record is to be modified to correspond with a device block record based on parameters associated with the program operation, wherein the firmware block record tracks a plurality of entries of the device block record, and wherein at least some content of the plurality of entries of the device block record is inaccessible to the processing device; and
  responsive to determining that the firmware block record is to be modified, modifying the firmware block record to correspond with the device block record.

13. The method of claim 12, wherein determining whether the firmware block record is to be modified to correspond with the device block record based on the parameters associated with the program operation, comprises:
  determining that a number of entries of the firmware block record satisfies a threshold number of entries; and
  responsive to determining that the number of entries satisfies the threshold number of entries, determining that one or more of the parameters associated with the program operation satisfy one or more first conditions that correspond to the firmware block record.

14. The method of claim 13, wherein modifying the firmware block record to correspond with the device block record responsive to determining that the firmware block record is to be modified, comprises:
  responsive to satisfying the one or more first conditions, selecting a first entry of the firmware block record to be removed; and
  removing the first entry of the firmware block record.

15. The method claim 13, further comprising:
  responsive to satisfying the one or more first conditions, sending a command to remove a corresponding entry of the plurality of entries of the device block record at the memory device.

16. The method of claim 12, further comprising:
  submitting the request to perform the program operation at the memory device;
  wherein determining whether the firmware block record is to be modified to correspond with the device block record, comprises:
  determining whether the firmware block record is empty, and
  responsive to determining that the firmware block record is not empty, determining whether one or more of the parameters associated with the program operation satisfy one or more second conditions; and
  wherein modifying the firmware block record to correspond with the device block record comprises:
  responsive to determining that the one or more parameters satisfy the one or more second conditions, removing a second entry of the firmware block record.

17. A non-transitory computer-readable medium comprising instructions that, responsive to execution by a processing device, cause the processing device to perform operations comprising:
  receiving a request to perform a program operation at a memory device;
  determining whether a firmware block record is to be modified to correspond with a device block record based on parameters associated with the program operation, wherein the firmware block record tracks a plurality of entries of the device block record and wherein at least some content of the plurality of entries of the device block record is inaccessible to the processing device; and
  responsive to determining that the firmware block record is to be modified, modifying the firmware block record to correspond with the device block record.

18. The non-transitory computer-readable medium of claim 17, wherein determining whether the firmware block record is to be modified to correspond with the device block record based on the parameters associated with the program operation, the operations further comprising:
  determining that a number of entries of the firmware block record satisfies a threshold number of entries; and
  responsive to determining that the number of entries satisfies the threshold number of entries, determining that one or more of the parameters associated with the program operation satisfy one or more first conditions that correspond to the firmware block record.

19. The non-transitory computer-readable medium of claim 18, wherein modifying the firmware block record to correspond with the device block record responsive to determining that the firmware block record is to be modified, the operations further comprising:
  responsive to satisfying the one or more first conditions, selecting a first entry of the firmware block record to be removed; and
  removing the first entry of the firmware block record.

20. The non-transitory computer-readable medium claim 19, the operations further comprising:
  responsive to satisfying the one or more first conditions, sending a command to remove a corresponding entry of the plurality of entries of the device block record at the memory device.

* * * * *